United States Patent
Dave et al.

(10) Patent No.: US 8,566,668 B1
(45) Date of Patent: Oct. 22, 2013

(54) EDGE MEMORY ARCHITECTURE FOR LDPC DECODER

(75) Inventors: Sameep Dave, Stow, OH (US); Fan Mo, Stow, OH (US)

(73) Assignee: ViaSat, Inc., Carlsbad, CA (US)

( * ) Notice: Subject to any disclaimer, the term of this patent is extended or adjusted under 35 U.S.C. 154(b) by 166 days.

(21) Appl. No.: 12/984,013

(22) Filed: Jan. 4, 2011

Related U.S. Application Data

(60) Provisional application No. 61/292,014, filed on Jan. 4, 2010, provisional application No. 61/292,015, filed on Jan. 4, 2010.

(51) Int. Cl.
   *H03M 13/00* (2006.01)

(52) U.S. Cl.
   USPC ............ 714/759; 714/752; 714/763; 714/780

(58) Field of Classification Search
   USPC .......................... 714/758, 759, 763, 765, 752
   See application file for complete search history.

(56) References Cited

U.S. PATENT DOCUMENTS

| | | | | |
|---|---|---|---|---|
| 6,829,308 B2* | 12/2004 | Eroz et al. | | 375/271 |
| 7,500,172 B2* | 3/2009 | Shen et al. | | 714/780 |
| 2003/0023917 A1 | 1/2003 | Richardson et al. | | |
| 2003/0033575 A1* | 2/2003 | Richardson et al. | | 714/799 |
| 2005/0005231 A1* | 1/2005 | Sun et al. | | 714/801 |
| 2005/0204271 A1* | 9/2005 | Sharon et al. | | 714/801 |
| 2006/0107181 A1* | 5/2006 | Dave et al. | | 714/758 |
| 2008/0104474 A1* | 5/2008 | Gao et al. | | 714/752 |

OTHER PUBLICATIONS

Sankar, H.; Narayanan, K.R.; , "Memory-efficient sum-product decoding of LDPC codes," Communications, IEEE Transactions on, vol. 52, No. 8, pp. 1225-1230, Aug. 2004.*

* cited by examiner

*Primary Examiner* — Steve Nguyen

(74) *Attorney, Agent, or Firm* — Holland & Hart LLP

(57) ABSTRACT

Systems, devices, and methods are disclosed for a novel edge memory architecture. An architecture is described wherein the extrinsic information typically stored inside the edge memory is reformatted. Instead of storing the extrinsic information for every edge, the novel edge memory stores a set of possible extrinsic information values for a check node in a "value memory." The edge memory also stores an index for each edge in a second, "index memory," identifying which value stored in the value memory applies to each respective edge.

24 Claims, 7 Drawing Sheets

US 8,566,668 B1

EDGE MEMORY ARCHITECTURE FOR LDPC DECODER

CROSS-REFERENCES TO RELATED APPLICATIONS

This application claims benefit of priority under 35 U.S.C. 119(e) of U.S. Provisional Patent Application No. 61/292,014, filed on Jan. 4, 2010, entitled "EDGE MEMORY ARCHITECTURE FOR LDPC DECODER," and is related to U.S. Provisional Patent Application No. 61/292,015, filed on Jan. 4, 2010, entitled "LDPC DECODER ARCHITECTURE," the entirety of each of which is hereby incorporated by reference for all purposes.

BACKGROUND

Embodiments of the invention described herein generally relate to forward error correction (FEC) and, more specifically, to low-density parity-check (LDPC) encoding and decoding for satellite communications.

Forward error correction (FEC) is a method of transmitting redundant information with transmitted data to allow a receiver to reconstruct the data if there is an error in the transmission. At a transmitter, a structured redundancy may be added in the form of some parity bits by encoding the data. This structured redundancy may be exploited at the receiver by decoding to correct any errors introduced during transmission.

Some FEC coding schemes incorporate iterative decoding by a decoder. Turbo codes and LDPC codes are examples of coding schemes that may be iteratively decoded. However, because of the complexity of these coding schemes, there may be very significant memory and processing resources required in some implementations of the decoder. LDPC edge memory, in particular, can have a very substantial footprint in many traditional LDPC decoder designs. There is, thus, a need in the art to reduce the size of the edge memory while maintaining performance.

SUMMARY

Systems, devices, and methods are disclosed related to a novel edge memory architecture. Edge memory is typically used to store the extrinsic information generated during each iteration of the decoding process for all the edges (i.e., the connections between the bit nodes and the check nodes). An architecture is described wherein the extrinsic information typically stored inside the edge memory is reformatted. Instead of storing the extrinsic information for every edge, the novel edge memory stores a set of possible extrinsic information values for a check node (in "value" memory). The edge memory also stores an index for each edge (in "index" memory) identifying which value stored in the value memory applies to each respective edge. This separation of the edge memory into two novel parts (value memory and index memory) may reduce the size of edge memory.

An example of a communication terminal according to the disclosure includes: a decoding circuit configured to decode encoded data that has been encoded according to a coding scheme defining a parity check matrix, wherein the parity check matrix defines parity equations and edges between bit nodes and check nodes, the decoding circuit including: an input buffer configured to store channel soft information; a BNP accumulation module configured to read the channel soft information, to access extrinsic information for edges, and to generate accumulated values for edges by summing the channel soft information and the extrinsic information for edges; a controller module configured to reformat the accumulated values for edges as multiple candidate values and multiple indexes, each index identifying one of the candidate values as applying to a respective edge; edge memory configured to store the reformatted accumulated values for edges as the multiple candidate values and the multiple indexes; a BNP calculation module configured to access extrinsic information for edges of a previous CNP iteration and to generate extrinsic information inputs for edges for a new CNP iteration by subtracting the extrinsic information for edges of the previous CNP iteration from the reformatted accumulated values for edges; a CNP processor module configured to generate output extrinsic information for edges using the extrinsic information inputs for edges generated by the BNP calculation module; and an output buffer configured to store output data from the BNP accumulation module when a determination is made that all parity equations defined by the parity check matrix are satisfied.

Embodiments of such a communication terminal may include one or more of the following features. Reformatting the accumulated values for edges as the multiple candidate values and the multiple indexes includes a selection process defined by a selection criterion and a selection value. The CNP processor module generates the output extrinsic information for edges with an accumulation operation using as operands the extrinsic information inputs for edges generated by the BNP calculation module; and the selection process identifies the operands which have a higher probability of dominating results of the accumulation operation of the CNP processor module. The selection criterion is least reliability, the selection value is three, and the selection process identifies the three operands which have a least reliability of the extrinsic information inputs for edges. The edge memory includes a value memory portion configured to store the multiple candidate values and an index memory portion configured to store the multiple indexes, each index including a reference to a respective candidate value and a sign of the respective candidate value. The coding scheme includes an LDPC code. The communication terminal is a satellite modem.

An example of a method for decoding encoded data that has been encoded according to a coding scheme defining a parity check matrix, the parity check matrix defining parity equations and edges between bit nodes and check nodes includes: receiving channel soft information; accessing extrinsic information for edges; generating accumulated values for edges by summing the channel soft information and the extrinsic information for edges; reformatting the accumulated values for edges as multiple candidate values and multiple indexes, each index identifying one of the candidate values as applying to a respective edge; storing the reformatted accumulated values for edges as the multiple candidate values and the multiple indexes; accessing extrinsic information for edges of a previous CNP iteration; generating extrinsic information inputs for edges for a new CNP iteration by subtracting the extrinsic information for edges of the previous CNP iteration from the reformatted accumulated values for edges; generating extrinsic information output for edges using the extrinsic information inputs for edges; updating the bit nodes by summing the extrinsic information output for edges associated with the respective bit nodes; determining that all parity equations defined by the parity check matrix are satisfied; and storing output bit node data.

Embodiments of such a method may include one or more of the following features. Reformatting the accumulated values for edges as the multiple candidate values and the multiple indexes includes selecting based on a selection criterion and a selection value. Generating the extrinsic information output for edges includes generating output extrinsic information for edges with an accumulation operation using as operands the extrinsic information inputs for edges; and selecting includes identifying the operands which have a higher probability of dominating results of the accumulation operation. The selection criterion is least reliability, the selection value is three, and selecting includes identifying the three operands which have a least reliability of the extrinsic information inputs for edges. Storing the reformatted accumulated values for edges includes storing the multiple candidate values in a value memory portion of edge memory and storing the multiple indexes in an index memory portion of the edge memory, each index including a reference to a respective candidate value and a sign of the respective candidate value. The coding scheme includes an LDPC code.

An example of a communication terminal includes: a decoding circuit configured to decode encoded data that has been encoded according to a coding scheme defining a parity check matrix, wherein the parity check matrix defines parity equations and edges between bit nodes and check nodes, the decoding circuit including: a CNP processor module configured to calculate extrinsic information for all bit nodes connected by edges to respective check nodes during decoding iterations; one or more BNP processor modules configured to combine extrinsic information for check nodes connected by edges to respective bit nodes to provide updated extrinsic information inputs to the CNP processor module during decoding iterations; and edge memory configured to store multiple candidate extrinsic information values for check nodes and to store multiple indexes, each index identifying one of the candidate extrinsic information values as applying to a respective edge.

Embodiments of such a communication terminal may include one or more of the following features. The one or more BNP processor modules include a BNP accumulation module and a BNP extrinsic information calculation module. The decoding circuit further includes a controller configured to reformat accumulated values for edges generated by the one or more BNP processor modules as the multiple candidate extrinsic information values and the multiple indexes. The CNP processor module is configured to calculate the extrinsic information with an accumulation operation using as operands the updated extrinsic information inputs generated by the one or more BNP processor modules; and the controller is configured to reformat the accumulated values for edges by identifying the operands which have a higher probability of dominating results of the accumulation operation of the CNP processor module. The operands identified have the least reliability of the updated extrinsic information inputs. The operands identified have the smallest of the updated extrinsic information inputs. The coding scheme includes an LDPC code.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This description provides example embodiments only, and is not intended to limit the scope, applicability, or configuration of the invention. Rather, the ensuing description of the embodiments will provide those skilled in the art with an enabling description for implementing embodiments of the invention. Various changes may be made in the function and arrangement of elements without departing from the spirit and scope of the invention.

Thus, various embodiments may omit, substitute, or add various procedures or components as appropriate. For instance, it should be appreciated that in alternative embodiments the methods may be performed in an order different from that described, and that various steps may be added, omitted, or combined. Also, features described with respect to certain embodiments may be combined in various other embodiments. Different aspects and elements of the embodiments may be combined in a similar manner.

It should also be appreciated that the following systems, methods, and software may individually or collectively be components of a larger system, wherein other procedures may take precedence over or otherwise modify their application. Also, a number of steps may be required before, after, or concurrently with the following embodiments.

Systems, devices, methods, and software are described related to a novel edge memory design for an LDPC decoder. Instead of storing the extrinsic information for each edge, the edge memory stores a set of possible extrinsic information values for a check node (value memory), and then stores an index for each edge (index memory) that identifies the value that applies to each edge. This separation of the edge memory into two parts (value memory and index memory) may reduce the size of edge memory. Example embodiments of device and system architectures are described herein with respect to LDPC codes, LDPC decoding, and a novel indexing architecture. However, these may be adapted for other FEC coding schemes.

Figure 1:
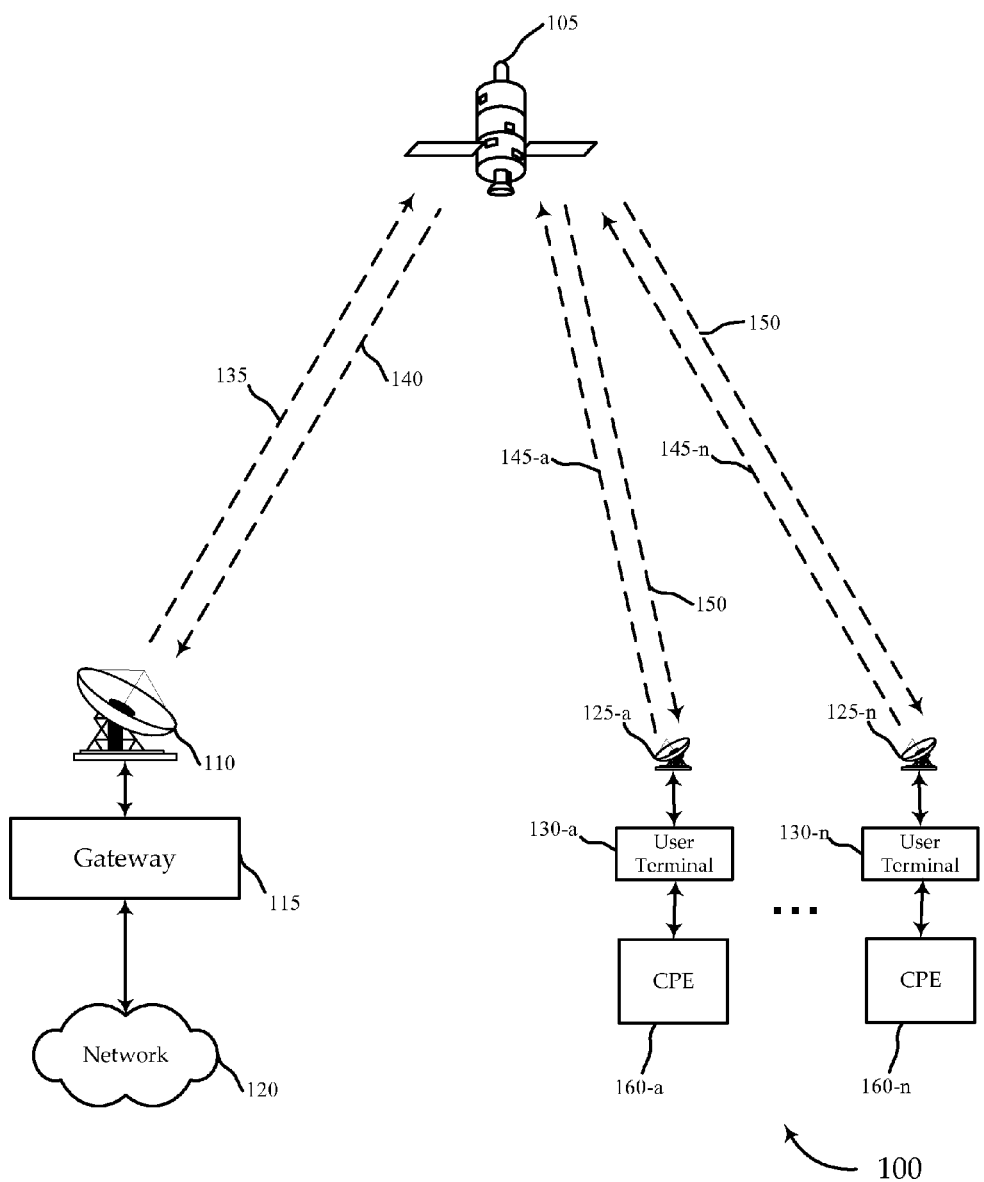
FIG. 1 is a simplified diagram of an example satellite communications system in which the methods and apparatuses of the present invention may be used.

LDPC and turbo codes are often used in satellite communications. Referring first to FIG. 1, a block diagram illustrates an example satellite communications system 100 configured according to various embodiments of the invention. While a satellite communications system is used to illustrate various aspects of the invention, it is worth noting that certain principles set forth herein are applicable to a number of other wireless systems, as well. The satellite communications system 100 includes a network 120, such as the Internet, interfaced with a gateway 115 that is configured to communicate with one or more user terminals 130, via a satellite 105.

The network 120 may be any type of network and can include, for example, the Internet, an IP network, an intranet, a wide-area network (WAN), a local-area network (LAN), a virtual private network (VPN), the Public Switched Telephone Network (PSTN), or any other type of network supporting data communication between any devices described herein. A network 120 may include both wired and wireless connections, including optical links. Many other examples are possible and apparent to those skilled in the art in light of this disclosure. The network 120 may connect the gateway 115 with other gateways (not pictured), which are also in communication with the satellite 105, and which may share information on link conditions and other network metrics.

The gateway 115 provides an interface between the network 120 and the user terminal 130. The gateway 115 may be configured to receive data and information directed to one or more user terminals 130, and format the data and signaling information for delivery downstream to the respective user terminals 130 via the satellite 105. In some embodiments, the gateway 115 may encode data to be transmitted downstream using LDPC codes.

The gateway 115 may also be configured to receive upstream signals from the satellite 105 (e.g., from one or more user terminals 130) directed to a destination in the network 120, and can format the received signals for transmission through the network 120. The novel LDPC decoding techniques and edge memory architectures described herein are, in many instances, described with reference to encoding and transmission at the gateway 115, and reception and decoding at the user terminal 130. However, in other embodiments, the LDPC decoding techniques and edge memory architectures may be applied to encoding and transmission at the user terminal 130, and reception and decoding at the gateway 115 (star) or user terminal 130 (mesh).

A device (not shown) connected to the network 120 may communicate with one or more user terminals 130 through the gateway 115. Data packets may be sent from a device in the network 120 to the gateway 115. The gateway 115 may format a series of frames in accordance with a physical layer definition for transmission to the satellite 105 via a downstream link 135. A variety of physical layer transmission modulation and coding techniques may be used with certain embodiments of the invention, including those defined with the DVB-S2 and WiMAX standards. In a number of embodiments, the gateway 115 utilizes adaptive coding and modulation (ACM) in conjunction with one or more of the LDPC coding techniques described herein (e.g., according to the DVB-S2 specification) to direct traffic to the individual terminals. The gateway 115 may use a broadcast signal, with a modulation and coding (the term "modcode" may be used interchangeably herein in exchange with "modulation and coding") format adapted for each packet to the link conditions of the user terminal 130 or set of user terminals 130 to which the packet is directed (e.g., to account for the variable service link 150 conditions from the satellite 105 to each respective user terminal 130).

The gateway 115 may use an antenna 110 to transmit the signal to the satellite 105. In one embodiment, the antenna 110 is a parabolic reflector with high directivity in the direction of the satellite and low directivity in other directions. The downstream signals 135, 150 may include, for example, one (or more) single carrier signals. Each single carrier signal may be divided in time (e.g., using Time-Division Multiple Access (TDMA) or other time-division multiplexing techniques) into a number of sub-channels. The sub-channels may be the same size, or different sizes, and a range of options will be addressed below. In some embodiments, other channelization schemes may be integrated with or used in place of time-divided sub-channels, such as Frequency-Division Multiple Access (FDMA), Orthogonal Frequency-Division Multiple Access (OFDMA), Code-Division Multiple Access (CDMA), or any number of hybrid or other schemes known in the art.

In one embodiment, a geostationary satellite 105 is configured to receive the signals from the location of antenna 110 and within the frequency band and specific polarization transmitted. The satellite 105 may, for example, use a reflector antenna, lens antenna, array antenna, active antenna, or other mechanism known in the art for reception and/or transmission of signals. The satellite 105 may process the signals received from the gateway 115 and transmit the signal from the gateway 115 to one or more user terminals 130. In one embodiment, the satellite 105 operates in a multi-beam mode, transmitting a number of narrow beams, each directed at a different region of the earth, allowing for frequency re-use. With such a multi-beam satellite 105, there may be any number of different signal switching configurations on the satellite 105, allowing signals from a single gateway 115 to be switched between different spot beams. In one embodiment, the satellite 105 may be configured as a "bent pipe" satellite, wherein the satellite 105 may frequency-convert the received carrier signals before retransmitting these signals to their destination, but otherwise perform little or no other processing on the contents of the signals. A variety of physical layer transmission modulation and coding techniques may be used by the satellite 105 in accordance with certain embodiments of the invention, including those defined with the DVB-S2 and WiMAX standards. For other embodiments, a number of configurations are possible (e.g., using LEO satellites, or using a mesh network instead of a star network), as evident to those skilled in the art.

The signals transmitted from the satellite 105 may be received by one or more user terminals 130, via the respective user antenna 125. In one embodiment, the antenna 125 and user terminal 130 together make up a very small aperture terminal (VSAT). In other embodiments, a variety of other types of antennas 125 may be used at the user terminal 130 to receive the signal from the satellite 105. The user terminals 130 may each include an implementation (or aspects of the implementation) of the novel decoder architecture disclosed herein to decode the LDPC encoded data. Each of the user terminals 130 may be a single user terminal 130 or, alternatively, be a hub or router (not pictured) that is coupled with multiple user terminals 130. Each user terminal 130 may be connected to consumer premises equipment (CPE) 160 (e.g., computers, local area networks, Internet appliances, wireless networks, etc.).

In one embodiment, a Multi-Frequency Time-Division Multiple Access (MF-TDMA) scheme is used for upstream links 140, 145, allowing efficient streaming of traffic while maintaining flexibility in allocating capacity among each of the user terminals 130. In this embodiment, a number of frequency channels are allocated which may be fixed, or which may be allocated in a more dynamic fashion. A TDMA scheme is then employed in each frequency channel. In this scheme, each frequency channel may be divided into several timeslots that can be assigned to a connection (i.e., a user terminal 130). In other embodiments, one or more of the upstream links 140, 145 may be configured with other schemes, such as TDMA, FDMA, OFDMA, CDMA, or any number of hybrid or other schemes known in the art.

A user terminal 130 may transmit information related to signal quality to the gateway 115 via the satellite 105. The signal quality may be a measured signal-to-noise ratio, an estimated signal-to-noise ratio, a bit error rate, a received power level, or any other communication link quality indicator. The user terminal 130 itself may measure or estimate the signal quality, or it may pass information measured or estimated by other devices. The user terminal 130 may specify a modcode to be used for transmission by the gateway 115 to the user terminal 130, or to the set of user terminals 130 near the user terminal 130. A user terminal 130 may also transmit data and information to a network 120 destination via the satellite 105 and gateway 115. The user terminal 130 transmits the signals via the upstream uplink 145 to the satellite 105 using the antenna 125. A user terminal 130 may transmit the signals according to a variety of physical layer transmission modulation and coding techniques, including those defined with the DVB-S2 and WiMAX standards. In various embodiments, the physical layer techniques may be the same for each of the links 135, 140, 145, 150, or may be different. The gateway 115 may, in some embodiments, use this signal quality information to implement ACM, adjusting the modcode formats to each user terminal 130 or set of user terminals 130 based on their link conditions. Thus, the gateway 115 may adapt the code rate of the LDPC codes for data to be transmitted downstream to user terminals 130.

Turning now to the use of LDPC codes in the described satellite network 100, the concept of LDPC codes may be generalized to all the linear block codes that can be represented by a sparse parity check matrix. These codes may be decoded using iterative soft-input soft-output (SISO) decoding, using one or more aspects of the novel decoder and edge memory architectures described herein. An iteration involves two processing stages—check node processing (CNP) and bit node processing (BNP). During the CNP stage, extrinsic information and parity bits involved in a parity check equation are gathered and new extrinsic information is calculated for all the related bits. During the BNP stage, the extrinsic information corresponding to the several parity check equations for any bit is combined to provide updated output information for the next iteration. In general, the information and parity bits may be referred to as bit nodes, and the parity check equations may be referred to as check nodes. The parity check matrix can be considered as an interconnection network between bit nodes and check nodes, and every connection is defined as an edge. It may be desirable to reduce the size of the edge memory, as the edge memory may occupy a large footprint in many conventional decoder designs. Aspects of the present invention relate to the storage of information in edge memory, and a novel indexing scheme to leverage certain redundancies inherent in some edge memory architectures to reduce the size of edge memory.

Figure 2:
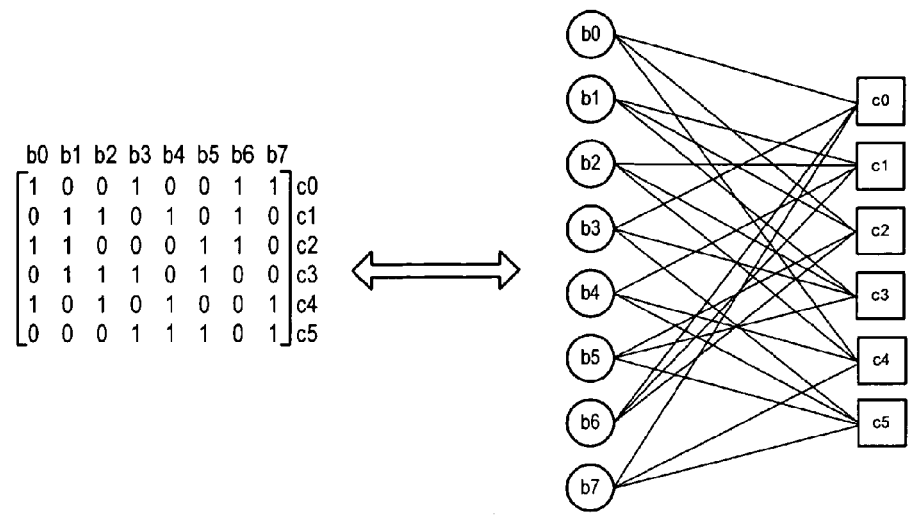
FIG. 2 is an example parity check matrix and an associated bipartite graph.

FIG. 2 is an example 200 parity check matrix A and an associated bipartite graph. In the bipartite graph, each bit node b0-b7 represents a corresponding column in the parity check matrix A, and each check node c0-c5 represents a corresponding row in the parity check matrix A. The example parity check matrix A is not an actual LDPC parity check matrix, and is provided for illustrative purposes only. Each "1" represents a bit involved in a parity check. Thus, for each code word $a=[a_0, a_1, \ldots a_7]$ received, the parity checks are based on:

$a_0+a_3+a_6+a_7,$ $a_1+a_2+a_4+a_6, \ldots$ etc. The received code word may be represented by soft information, the values of which may be used to initialize a matrix according to the parity check matrix A for iterative decoding. For example, if the soft information generated from a received code word is [0.22, 0.17, 0.78, 0.80, 0.87, 0.10, 0.25, 0.33], then an initialized matrix X according to the parity check matrix of FIG. 2 would be:

$$\begin{bmatrix} 0.22 & & & & 0.80 & & & 0.33 \\ & 0.17 & 0.78 & & & 0.87 & & 0.25 \\ 0.22 & 0.17 & & & & & 0.10 & 0.25 \\ & 0.17 & 0.78 & 0.80 & & & 0.10 & 0.25 \\ 0.22 & & 0.78 & & & 0.87 & & 0.33 \\ & & & 0.80 & & 0.87 & 0.10 & & 0.33 \end{bmatrix}$$

Each connection between a bit node and a check node is an edge, and corresponds to a "1" in the parity check matrix A. Because the parity check matrix A has a column weight of 3 and a row weight of 4, each bit node is connected to three edges and each check node is connected to four edges. During the iterative decoding process, each check node provides a bit node estimate to a bit node based on information from other related bit nodes. Each bit node, in return, provides an estimate of its own value based on information from other related check nodes. The process continues until all parity check equations are satisfied, indicating a valid decode, or until a maximum number of iterations is reached without satisfying all parity check equations, indicating a decoding failure.

During decoding, a value may be assigned to each edge of a bipartite graph that is representative of a channel value associated with a bit node to which the edge is connected. Check nodes are then updated by accumulating the edge values according to a log-likelihood operation G:

$$G(a, b) = \ln \frac{1 + e^{a+b}}{e^a + e^b}.$$

Bit nodes may thereafter be updated with the update edge values by summing the edge values associated with the bit node. Thereafter, the system determines if all parity equations are satisfied or if a maximum number of iterations has been reached if all parity equations are not satisfied.

The interconnection between the bit nodes and check nodes in an LDPC code is typically pseudo-random. To facilitate high-speed decoding with reasonable complexity, a structure is often imparted in the code design so that the connections to the check nodes for a group of bit nodes are a linear translation of each other, i.e., some or all of the parity equations may be a linear translation of one particular parity equation. For example, a parity check matrix may define the following sets of linearly shifted parity check equations (1) and (2):

$a_0+a_8+a_{16}+a_{32}=0,$ $a_1+a_9+a_{17}+a_{33}=0,$ $a_2+a_{10}+a_{18}+a_{34}=0 \ldots$ (1)

$a_0+a_{10}+a_{20}+a_{30}=0,$ $a_1+a_{11}+a_{21}+a_{31}=0,$ $a_2+a_{12}+a_{22}+a_{32}=0 \ldots$ (2)

etc. Thus, in the linearly shifted parity check equation (1), operands $a_0$, $a_1$, and $a_2$ correspond to the first operand $a_p$, operands $a_8$, $a_9$, and $a_{10}$ correspond to the second operand $a_{p+8}$, and so on. Such a code structure facilitates parallelizing the decoding process.

Memory size and access can present unique implementation challenges. Multiple bits of soft-extrinsic information for all the edges between bit nodes and check nodes are stored. The memory for storing such information is often referred to as edge memory. Additionally, during the iterative decoding process, the bit node processors may require the original soft-input from the channel. The size of the various memories depends on the block size, the resolution of soft-information, and also the average number of edges per bit, and may be relatively large for large block code sizes. Additionally, a highly-parallel decoder will read from and write to memory stores in a highly-parallel fashion. Thus, for a degree of parallelism "p" the decoder may read and write p blocks of information at a time from these memories. For example, the sets of linearly shifted parity check equations (1) and (2) above define a first degree of parallelism p and a second degree of parallelism p. The values of p may differ for each degree of parallelism, e.g., the first degree of parallelism p may be 8, and the second degree of parallelism may be 16. The values of p may also be the same for some or all degrees of parallelism. Thus, edge memory can often encompass a large portion of the real estate in a decoder.

As illustrated above, powerful LDPC codes are based on complex interconnection of the bit nodes and check nodes, so gathering and storing the data to perform highly parallel check node processing and bit node processing operations is a design challenge for efficient decoder implementation. However, the information in the edge memory for many LDPC decoder designs may be simplified to create certain redundancies in the edge information. A novel indexing scheme is described herein to leverage these redundancies.

Figure 3:
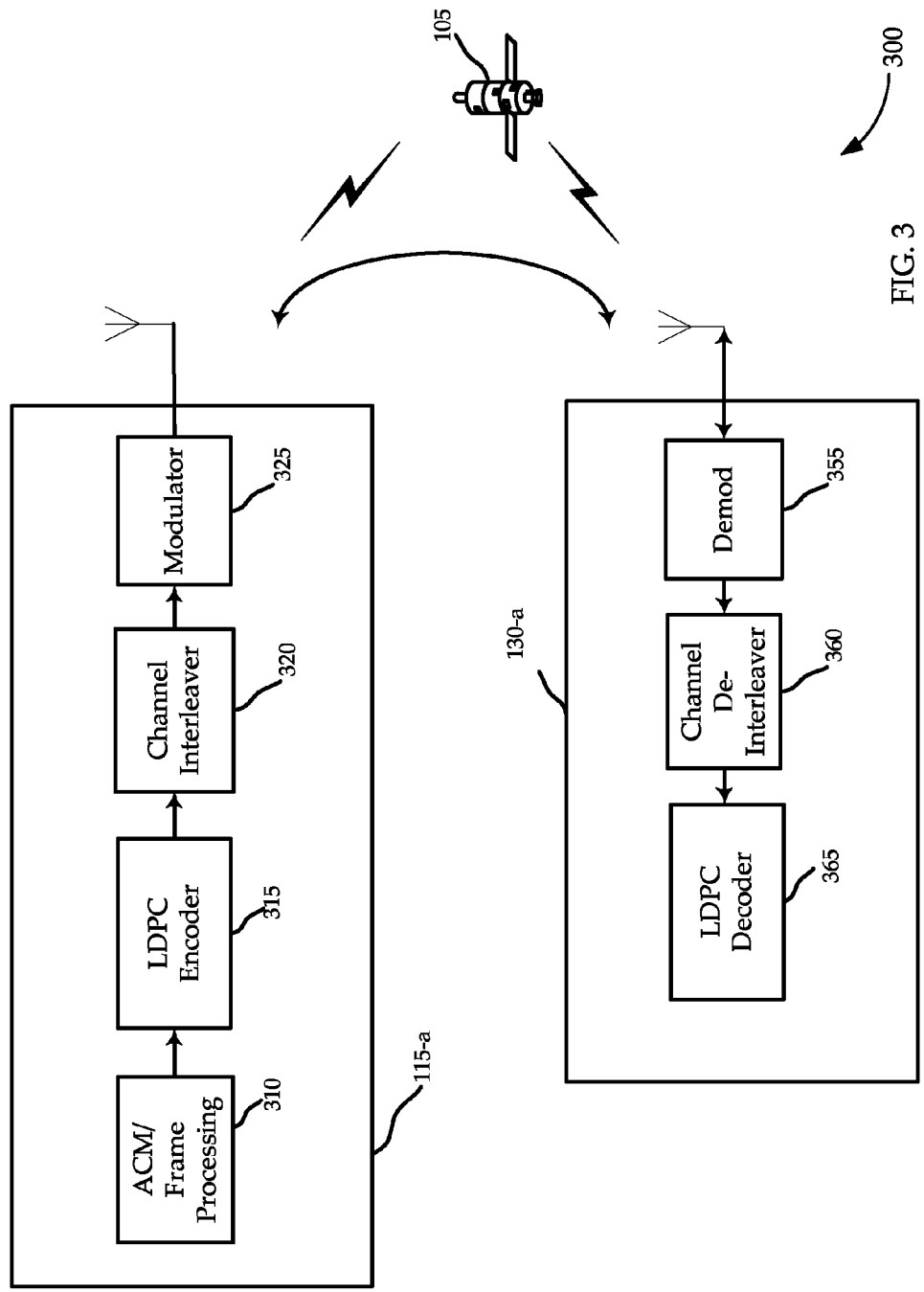
FIG. 3 is a block diagram of an example configuration of a device of the satellite communications system of FIG. 1.

Referring to FIG. 3, a block diagram is shown illustrating an example configuration 300 for certain devices of the satellite communications system 100 of FIG. 1. While the example configuration illustrates communication between a gateway 115-*a* and a user terminal 130-*a*, those skilled in the art will recognize that similar components may be used between other links for the same or other types of terminals, or between a satellite and a terminal.

In one embodiment, an initiating terminal (not shown) transmits data via a network (e.g. network 120) to the gateway 115-*a* for transmission downstream. The data is received by the gateway 115-*a*. The received data may, for example, be a series of IP packets. The gateway 115-*a* includes an ACM/frame processing module 310, an LDPC encoder module 315, a channel interleaver module 320, and a modulator module 325.

After some intermediate processing by other components (not shown) of the gateway 115-*a*, the data may be received by the ACM/frame processing module 310. The ACM/frame processing module 310 may identify, for each of the packets of the stream, a modcode format from a number of different modcode formats. The identified modcode format may be based on the link condition associated with a destination for each respective packet.

ACM/frame processing module 310 may also define a series of frames. These may be frames defined according to the DVB-S2 framing format. Thus, the frames may each include a physical layer header to be transmitted at a very robust code rate. The physical layer header may include a unique word and signaling information. The payload for each frame may be encoded using LDPC codes at the adapted code rate (based on, for example, the link condition for the destination terminal or the type of programming).

Figure 4:
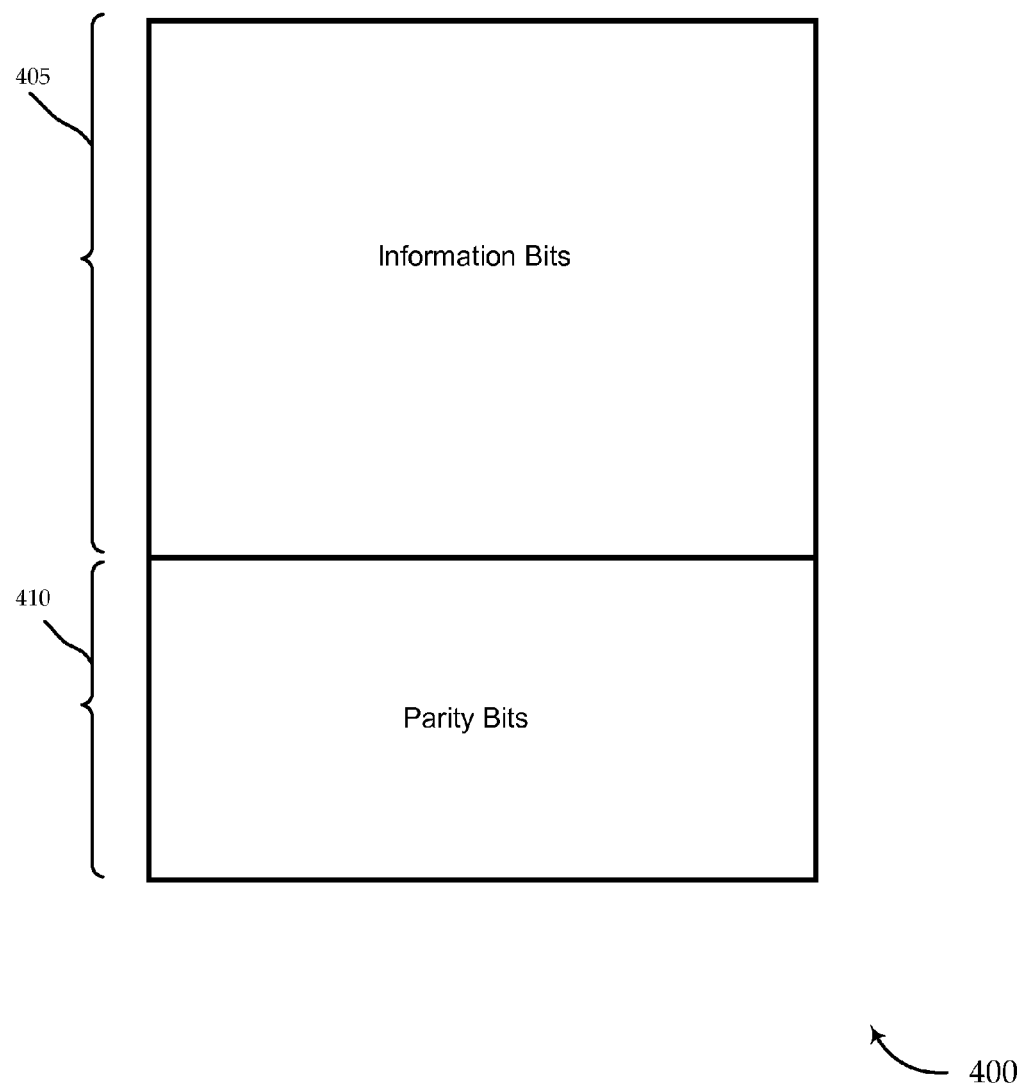
FIG. 4 is a block diagram of an example LDPC block.

Therefore, the ACM/frame processing module 310 may set the payload size and code rate for each frame, and thus determine the amount of information that is to be forwarded to the LDPC encoder module 315 for encoding for each frame. Turning briefly to FIG. 4, a block diagram illustrates an example LDPC block 400 for a frame. As noted, once the payload size and code rate are known for a frame, a block size for the information bits 405 is known. ACM/frame processing module 310 may forward the information bits 405 to the LDPC encoder module 315. The LDPC encoder module 315 may then generate a set of parity bits 410 (e.g., according to the code rate and the DVB-S2 specification). Together, information bits 405 and parity bits 410 may make up the LDPC block 400 for a given frame.

Turning back to FIG. 3, the LDPC encoder 315 may forward the LDPC block 400 (which may be rearranged before transmission from the gateway 115-*a* to facilitate parallel processing at the decoder) for a given frame to a channel interleaver module 320 for interleaving. The channel interleaver module 320 may perform intra-block interleaving and/or inter-block interleaving, based on channel characteristics. This channel interleaving may be based on any one of a number of traditional interleaving schemes known in the art. The channel interleaver module 320 may then forward the frame with the payload to be processed by the modulator module 325 for modulation (according to the assigned modulation format and DVB-S2 specification) and transmission via a wireless signal through the satellite 105 to the user terminal 130-*a*.

At the user terminal 130-*a*, the transmitted signal is received. The user terminal 130-*a* in this embodiment is made up of a demodulator module 355, channel de-interleaver module 360, and LDPC decoder module 365. These components (355-365) may be implemented, in whole or in part, in hardware. Thus, they may be made up of one, or more, Application Specific Integrated Circuits (ASICs) adapted to perform a subset of the applicable functions in hardware. Alternatively, the functions may be performed by one or more other processing units (or cores), on one or more integrated circuits. In other embodiments, other types of integrated circuits may be used (e.g., Structured/Platform ASICs, Field Programmable Gate Arrays (FPGAs), and other Semi-Custom ICs), which may be programmed in any manner known in the art. Each may also be implemented, in whole or in part, with instructions embodied in a computer-readable medium, formatted to be executed by one or more general or application specific processors. Thus, the device 130-*a* may include different types and configurations of memory (not shown), which may be integrated into the hardware or may be one or more separate components.

The demodulator module 355 may downconvert, amplify, and demodulate the signal, thereby producing a soft-information version of the interleaved LDPC block (i.e., the block that was forwarded by the channel interleaver module 320 to the modulator module 325). This is then forwarded to the channel de-interleaver module 360, wherein the block (or blocks) are de-interleaved, thereby producing a soft-information version of the LDPC block 400 (i.e., the block that was forwarded by the LDPC encoder 315 to the channel interleaver module 320). The channel de-interleaver module 360 may forward the soft-information version of the LDPC block 400 to the LDPC decoder 365 for decoding.

Figure 5:
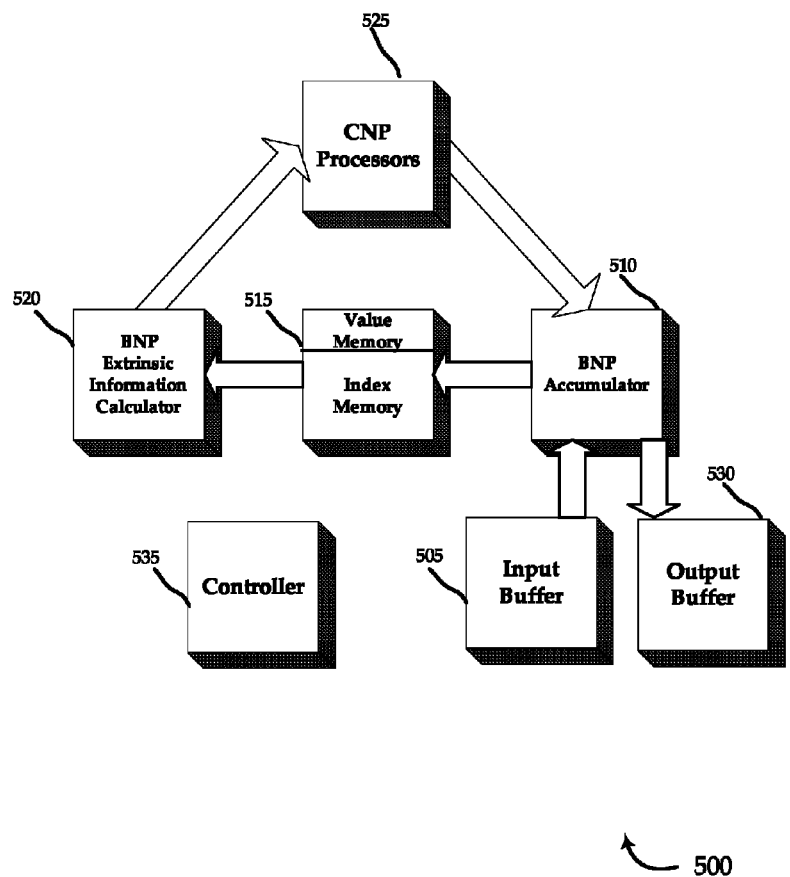
FIG. 5 is a block diagram of a more specific example of an LDPC decoder, which may be the LDPC decoder of FIG. 3.

Turning next to FIG. 5, a block diagram illustrates a more specific example of an LDPC decoder 500, which may be the LDPC decoder 365 of FIG. 3. The LDPC decoder 500 includes input buffer 505, a BNP accumulator 510, an edge memory 515, a BNP extrinsic information calculator 520, CNP processors 525, output buffer 530, and controller 535. The edge memory 515 may be located at the center of the decoder 500, surrounded by CNP 525 and BNP 510, 520 processing modules with their own memories. Thus, the BNP may be split into two parts: the BNP accumulator 510 and the BNP extrinsic information calculator 520. When the CNP processors 525 are completed with processing and the edge information is ready to be written back to the edge memory 515, the BNP accumulator 510 may collect the channel information and the extrinsic information for the edges associated with a particular bit.

The controller 535 may reformat the extrinsic information for storage in the edge memory 515, which includes a value memory and an index memory. The edge memory 515 stores a set of possible values (in value memory), which may be relatively small. The edge memory 515 also stores an index for each edge (in index memory) identifying which value stored in the value memory applies to each respective edge. The determinations and calculations related to the value memory and index memory will be discussed in more detail below. At the other side of the of edge memory 515, the BNP extrinsic information calculator 520 may ascertain the extrinsic information from the previous CNP iteration and subtract this extrinsic information from the aggregated BNP values to create the new extrinsic information inputs for the new iteration of CNP.

As noted, the edge memory 515 may store the reformatted extrinsic information for the edges for the LDPC code. For an LDPC code block (e.g., block 400 of FIG. 4) of 64 Kb, there may be an average of three to four edges per bit. Moreover, to provide sufficient resolution for good performance, the extrinsic information for every edge in conventional designs may need to be a 6 bit or higher resolution number. In highly parallel designs, the edge memory may need to allow massively parallel read and write ports to support BNP and CNP parallel processing. The edge memory 515 may thus need to be large and two-port, while also being very wide and not so deep. The size and complexity of edge memory 515 can be significant. Thus, reducing the footprint of edge memory 515 using the described indexing architecture may provide cost and power saving advantages.

Turning to a more specific example discussion of FIG. 5, the input buffer 505 is configured to store channel soft input (received, for example, from the channel de-interleaver module 360 of FIG. 3). A BNP accumulator 510 may include a parallel BNP processor array. BNP accumulator 510 receives channel soft information. BNP accumulator 510 also receives the edge values coming from the CNP processors 525, and sums these edge values with the original soft channel information $X_0$ for storage in edge memory 515. As noted, the edge memory 515 may include a value memory and an index memory. The controller 535 may reformat the data from the BNP accumulator 510 to generate: 1) a set of possible values (for storage in the value memory portion of edge memory 515), and 2) a set of data identifying which value stored in the value memory applies to each respective edge (for storage in the index memory portion of edge memory 515).

BNP extrinsic information calculator 520 accesses the edge memory 515, and generates extrinsic information for a particular edge by subtracting the original extrinsic information from the newly summed edge value of that edge. Thus, BNP extrinsic information calculator 520 subtracts extrinsic information of a previous CNP iteration from the accumulated BNP values to create the new extrinsic information inputs for the new iteration of CNP processing by the CNP processors 525.

At any check node processor, the data for the different edges can be provided serially for a pipelined implementation or in batches for a parallel implementation. The BNP accumulator 510 thereafter updates the bit nodes with the updated edge values by summing the edge values associated with the bit node. When a determination is made that all parity equations are satisfied, output data may be stored in an output buffer 530.

It is worth noting that the edge memory design described herein (e.g., including a value memory portion and an index memory portion) may be used in any number of LDPC decoder designs, and should not be limited to the specific design described above. For example, referring to the decoder design and the edge memory 28 described with reference to FIG. 2 of commonly assigned U.S. Pat. No. 7,760,880 entitled "Decoder Architecture System and Method" issued to Dave et al., the entirety of which is herein incorporated by reference for all purposes, a similar index memory/value memory design may be used.

A more specific example of the division of edge memory will now be set forth to further illustrate certain embodiments of the invention. This architecture may, for example, be used for storage of information in the edge memory 515 of FIG. 5, but may be used in other edge memory architectures, as well.

First, it is worth providing an example of how extrinsic information may be generated in the CNP processing. One way to create the indexing scheme is to use a simplified G operation described with reference to FIGS. 3-7 of U.S. Pat. No. 7,760,880. Accumulations via the G operation yield a result that is dominated by smaller input values. A decoding algorithm may be based on log likelihood ratios that are, in turn, based on logarithms of probability calculations. Thus, the multiplication or division of probabilities involves simple additions or subtractions of the log likelihood ratios. Addition or subtraction of the log likelihood ratio values, however, may require special accumulation functions in the logarithmic domain. Depending upon the exact nature of the calculations, these accumulation functions have the tendency of being dominated by a small group of operands. The G operation is one such operation that has the tendency to produce an output dominated by a small subset of operands. In particular, the G operation has the tendency of producing an output that is dominated by the smaller of the input values.

The tendency of the G operation to produce an output dominated by the smaller input values may be exploited by using the indexing techniques and architecture described herein. In this decoding method, a forward pass through the input values is reduced to a selection process. The selection process may identify the operands among the incoming data that are likely to dominate the results of the operation (these may then be used for the set of possible values to be stored in value memory). The selection process may include a selection criterion that defines how the selections are made, and a selection value that defines how many selections are made. This may be the selection process described with reference to FIG. 6 of U.S. Pat. No. 7,760,880.

The selection criterion may be a property or metric that depends on the particular operation being simplified. For example, in some cases, the magnitude of the operands may be of primary interest, and thus the selection is made based on only the few smallest or largest values. Likewise, in some cases polarity may be the primary interest. The CNP selection criterion in one embodiment may be based on the smallest magnitudes of the input values, as the output of the G operation is dominated by these smaller input values.

The selection value reflects a trade-off between implementation complexity and accuracy. The actual trade-off depends upon the operation, but in general increasing the number of selections results in increased accuracy and better performance while also leading to increased computational complexity. For the G operation, a selection value of three will be used for purposes of example, although other selection values may also be used.

In one embodiment, a first step may be to find the least reliability edges for any CNP, and then perform the G operation on two out of these three values to generate the extrinsic information for all the edges. The extrinsic information has a sign dependent upon the XOR of the other edges, and the reliability is one out of three values (to be stored in a value memory portion of edge memory). Therefore, in the index memory portion of edge memory, if the sign is stored along with a reference to a reliability value (out of 3), only a three-bit storage would be needed per edge (in the index memory portion).

It is worth noting that three 5-bit extrinsic information values would not be stored for every set of edges for a check node. Instead, for a 64 Kb block size code of code rate 9/10, the storage requirement may be 64 Kb*1/10*3*5=96 Kb for the value portion of edge memory. Thus, the memory requirement for this example may, in one embodiment, be reduced to approximately 850 Kb. Compare this to a conventional approach for an LDPC code of block size 64 Kb, where there is an average of 3-4 edges per bit, and to provide sufficient resolution for good performance, the extrinsic information for every edge needs to be a six bits or higher resolution number. This translates into a memory requirement for the conventional approach of approximately 1.5 Mb. Thus, in one example the memory requirement reduction may be approximately 45%.

Figure 6:
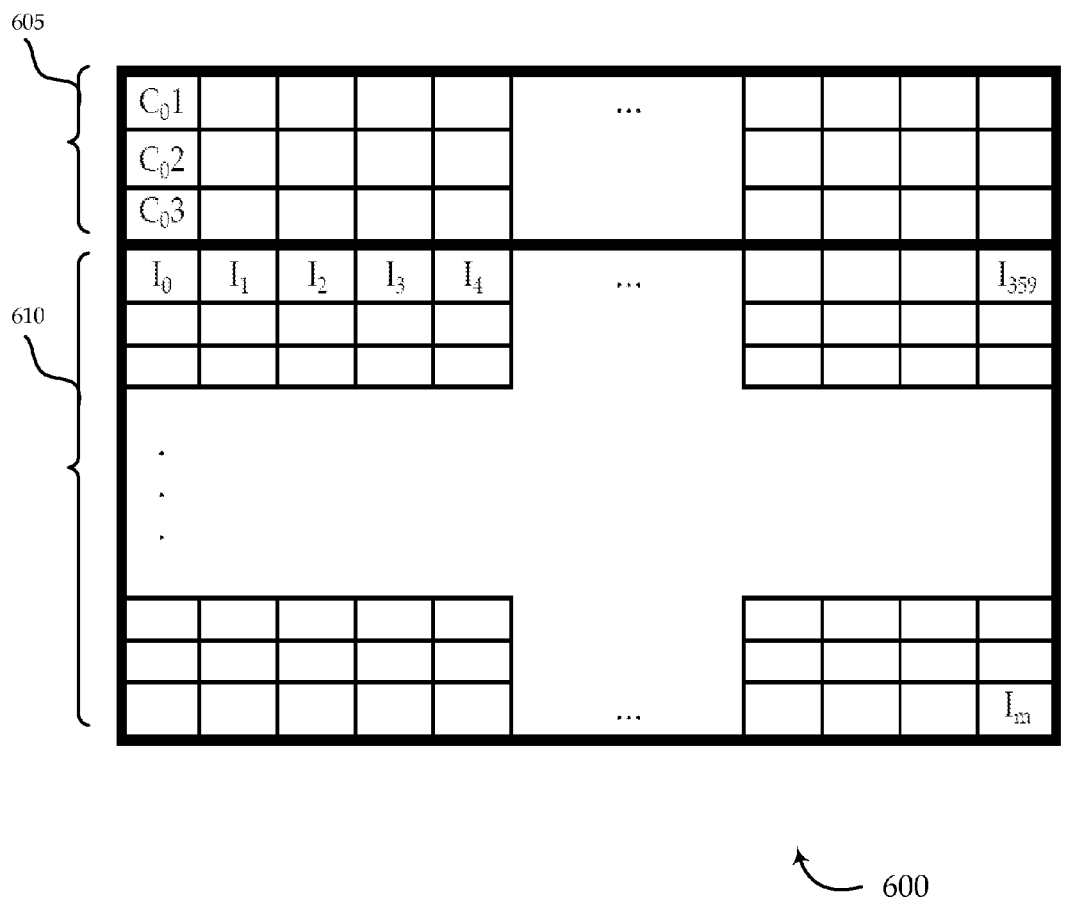
FIG. 6 is a block diagram of an example edge memory design.

Turning to FIG. 6, an example edge memory 600 design is disclosed. This edge memory 600 may be the edge memory 515 described with reference to FIG. 5, or may be implemented in any number of other decoders. The edge memory 600 architecture includes value memory 605 and index memory 610. The value memory 605 stores a set of possible extrinsic information values for a check node. In the illustrated embodiment, there are three illustrated reliability values ($C_o1, C_o2, C_o3$), while in other embodiments there may be different numbers of values stored (see, e.g., the discussion on selection value above).

The index memory 610, in this embodiment, stores an index value for each edge identifying which value stored in the value memory 605 applies to each respective edge. In one embodiment, there are three bits of information stored for each edge in the index memory 610 (one bit for sign, two bits to identify one of the three corresponding values in the value memory 605).

Figure 7:
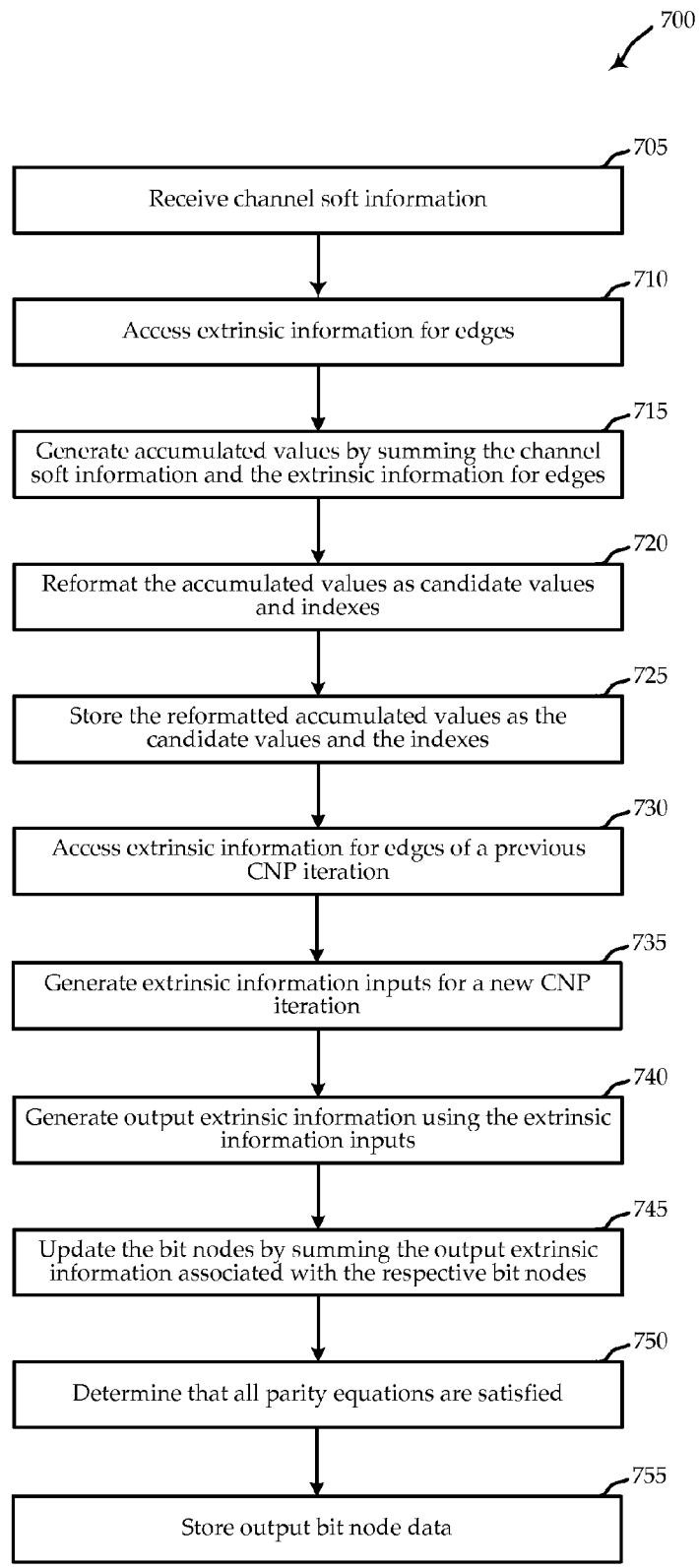
FIG. 7 is a flow diagram illustrating an example method for decoding encoded data.

The features of the various embodiments of FIGS. 3 and 5-6 may be implemented in a number of ways according to the specification. Further, the components and functionalities in those figures may be used to perform a number of different methods according to the specification. FIG. 7 provides a flow diagram illustrating an example method for decoding encoded data that has been encoded according to a coding scheme defining a parity check matrix. The parity check matrix defines parity equations and edges between bit nodes and check nodes.

The method 700 may begin at block 705 by receiving channel soft information. Extrinsic information for edges may be accessed at block 710 (e.g., by the BNP accumulator 510 of FIG. 5). Accumulated values for edges may be generated by summing the channel soft information and the extrinsic information for edges (e.g., by the BNP accumulator 510) at block 715.

At block 720, the accumulated values for edges may be reformatted as multiple candidate values and multiple indexes, where each index identifies one of the candidate values as applying to a respective edge (e.g., by the controller 535).

At block 725, the reformatted accumulated values for edges may be stored as the multiple candidate values and the multiple indexes (e.g., by the edge memory 515). In some implementations, the multiple candidate values are stored in a value memory portion of edge memory, and the multiple indexes are stored in an index memory portion of the edge memory. In some implementations, each index includes a reference to a respective candidate value and the sign of the respective candidate value.

Extrinsic information for edges of a previous CNP iteration may be accessed at block 730, e.g., by the BNP extrinsic information calculator 520. At block 735, extrinsic information inputs for edges may be generated for a new CNP iteration by subtracting the extrinsic information for edges of the previous CNP iteration from the reformatted accumulated values for edges (e.g., by the BNP extrinsic information calculator 520).

Extrinsic information output for edges may be generated using the extrinsic information inputs for edges at block 740, e.g., by the CNP processors 525. At block 745, the bit nodes may be updated by summing the extrinsic information output for edges associated with the respective bit nodes. For example, the BNP accumulator 510 can update the bit nodes.

At block 750, a determination may be made that all parity equations defined by the parity check matrix are satisfied. If it is determined that all parity equations are satisfied, output bit node data may be stored (e.g., by the output buffer 530) at block 755. If it is determined that not all parity equations are satisfied, another decoding iteration with the BNP and CNP stages can be performed. In some implementations, decoding terminates if a maximum number of decoding iterations are reached before all parity equations are satisfied.

In some implementations, reformatting the accumulated values for edges includes selecting based on a selection criterion and a selection value. For example, generating the extrinsic information output for edges may include generating output extrinsic information for edges with an accumulation operation using as operands the extrinsic information inputs for edges. Selecting can then include identifying the operands which have a higher probability of dominating results of the accumulation operation. In some implementations, the selection criterion is least reliability, the selection value is three, and selecting includes identifying the three operands which have the least reliability of the extrinsic information inputs for edges. In some implementations, the coding scheme includes an LDPC code.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Moreover, as disclosed herein, the term "memory" or "memory unit" may represent one or more devices for storing data, including read-only memory (ROM), random access memory (RAM), magnetic RAM, core memory, magnetic disk storage mediums, optical storage mediums, flash memory devices, or other computer-readable mediums for storing information. The term "computer-readable medium" includes, but is not limited to, portable or fixed storage devices, optical storage devices, wireless channels, a sim card, other smart cards, and various other mediums capable of storing, containing, or carrying instructions or data.

Furthermore, embodiments may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A communication terminal comprising:
   a decoding circuit configured to decode data that has been encoded according to a coding scheme defining a parity check matrix, wherein the parity check matrix defines parity equations and edges between bit nodes and check nodes, the decoding circuit comprising:
   an input buffer configured to store channel soft information;
   a bit node processing (BNP) accumulation module configured to read the channel soft information, to access extrinsic information for edges, and to generate accumulated values for edges by summing the channel soft information and the extrinsic information for edges;
   a controller module configured to reformat the accumulated values into an index and a respective set of candidate values for each edge, each index identifying which one of the candidate values in the respective set to apply to the edge for that index;
   an edge memory configured to store the index and the respective set of candidate values for each edge;
   a BNP calculation module configured to access extrinsic information for edges of a previous check node processing (CNP) iteration and to generate extrinsic information inputs for edges for a new CNP iteration by subtracting the extrinsic information for edges of the previous CNP iteration from the reformatted accumulated values for edges;
   a CNP processor module configured to generate output extrinsic information for edges using the extrinsic information inputs for edges generated by the BNP calculation module; and
   an output buffer configured to store output data from the BNP accumulation module when a determination is made that all parity equations defined by the parity check matrix are satisfied.

2. The communication terminal of claim 1, wherein reformatting the accumulated values for edges into the index and the respective set of candidate values for each edge comprises a selection process defined by a selection criterion and a selection value.

3. The communication terminal of claim 2, wherein
   the CNP processor module generates the output extrinsic information for edges with an accumulation operation using as operands the extrinsic information inputs for edges generated by the BNP calculation module; and
   the selection process identifies the operands which have a higher probability of dominating results of the accumulation operation of the CNP processor module.

4. The communication terminal of claim 3, wherein the selection criterion is least reliability, the selection value is three, and the selection process identifies the three operands which have a least reliability of the extrinsic information inputs for edges.

5. The communication terminal of claim 1, wherein the edge memory comprises a value memory portion configured to store the set of candidate values for each edge and an index memory portion configured to store the index for each edge, each index including a reference to the one candidate value in the respective set to apply to the edge for that index and a sign of that one candidate value.

6. The communication terminal of claim 1, wherein the coding scheme comprises an LDPC code.

7. The communications terminal of claim 1, wherein the communication terminal is a satellite modem.

8. A method for decoding encoded data that has been encoded according to a coding scheme defining a parity check matrix, the parity check matrix defining parity equations and edges between bit nodes and check nodes, the method comprising:
   receiving channel soft information;
   accessing extrinsic information for edges;
   generating accumulated values for edges by summing the channel soft information and the extrinsic information for edges;
   reformatting the accumulated values for edges into an index and a respective set of candidate values for each edge, each index identifying which one of the candidate values in the respective set to apply to the edge for that index;
   storing the index and the respective set of candidate values for each edge;
   accessing extrinsic information for edges of a previous check node processing (CNP) iteration;
   generating extrinsic information inputs for edges for a new CNP iteration by subtracting the extrinsic information for edges of the previous CNP iteration from the reformatted accumulated values for edges;
   generating extrinsic information output for edges using the extrinsic information inputs for edges;

updating the bit nodes by summing the extrinsic information output for edges associated with the respective bit nodes;

determining that all parity equations defined by the parity check matrix are satisfied; and storing output bit node data.

9. The method of claim 8, wherein reformatting the accumulated values for edges into the index and the respective set of candidate values for each edge comprises selecting based on a selection criterion and a selection value.

10. The method of claim 9, wherein generating the extrinsic information output for edges comprises generating output extrinsic information for edges with an accumulation operation using as operands the extrinsic information inputs for edges; and selecting comprises identifying the operands which have a higher probability of dominating results of the accumulation operation.

11. The method of claim 10, wherein the selection criterion is least reliability, the selection value is three, and selecting comprises identifying the three operands which have a least reliability of the extrinsic information inputs for edges.

12. The method of claim 8, wherein storing the index and the respective set of candidate values for each edge comprises storing the set of candidate values for each edge in a value memory portion of edge memory and storing the index for each edge in an index memory portion of the edge memory, each index including a reference to the one candidate value in the respective set to apply to the edge for that index and a sign of that one candidate value.

13. The method of claim 8, wherein the coding scheme comprises an LDPC code.

14. A communication terminal comprising:

a decoding circuit configured to decode data that has been encoded according to a coding scheme defining a parity check matrix, wherein the parity check matrix defines parity equations and edges between bit nodes and check nodes, the decoding circuit comprising:

a check node processing (CNP) processor module configured to calculate extrinsic information for all bit nodes connected by edges to respective check nodes during decoding iterations;

one or more bit node processing (BNP) processor modules configured to combine extrinsic information for check nodes connected by edges to respective bit nodes to provide updated extrinsic information inputs to the CNP processor module during decoding iterations; and an edge memory configured to store an index and a respective set of extrinsic information candidate values for each edge, each index identifying which one of the candidate extrinsic information values in the respective set to apply to the edge for that index.

15. The communication terminal of claim 14, wherein the one or more BNP processor modules comprise a BNP accumulation module and a BNP extrinsic information calculation module.

16. The communication terminal of claim 14, wherein the decoding circuit further comprises a controller configured to reformat accumulated values for edges generated by the one or more BNP processor modules into the index and the respective set of candidate extrinsic information values for each edge.

17. The communication terminal of claim 16, wherein the CNP processor module is configured to calculate the extrinsic information with an accumulation operation using as operands the updated extrinsic information inputs generated by the one or more BNP processor modules; and the controller is configured to reformat the accumulated values for edges by identifying the operands which have a higher probability of dominating results of the accumulation operation of the CNP processor module.

18. The communication terminal of claim 17, wherein the operands identified have the least reliability of the updated extrinsic information inputs.

19. The communication terminal of claim 17, wherein the operands identified have the smallest magnitudes of the updated extrinsic information inputs.

20. The communication terminal of claim 14, wherein the coding scheme comprises an LDPC code.

21. A method for decoding data that has been encoded according to a scheme defining edges between bit nodes and check nodes in a parity check matrix, the method comprising:

generating accumulated values for the edges based at least in part on channel soft information and extrinsic information for the edges;

reformatting the accumulated values into an index and a respective set of candidate values for each edge, each index identifying which one of the candidate values in the respective set to apply to the edge for that index;

storing the indices and the respective sets of candidate values in an edge memory; and accessing from the edge memory those candidate values identified by the indices for use in a next check node iteration of the data decoding.

22. The method of claim 21, wherein each index comprises:

a reference identifying the one candidate value in the respective set to apply to the edge for that index, and a sign associated with the identified candidate value.

23. A communication terminal comprising a decoding circuit configured to decode data that has been encoded according to a coding scheme defining edges between bit nodes and check nodes in a parity check matrix, the decoding circuit comprising:

a first processor configured to generate accumulated values for the edges based at least in part on channel soft information and extrinsic information for the edges;

a controller configured to reformat the accumulated values into an index and a respective set of candidate values for each edge, each index identifying which one of the candidate values in the respective set to apply to the edge for that index;

an edge memory configured to store the indices and the respective sets of candidate values; and a second processor configured to access from the edge memory those candidate values identified by the indices to use in a next check node iteration of the data decoding.

24. The communication terminal of claim 23, wherein each index comprises:

a reference identifying the one candidate value in the respective set to apply to the edge for that index, and a sign associated with the identified candidate value.

* * * * *